US012663480B1

(12) United States Patent
Hardiman

(10) Patent No.: US 12,663,480 B1
(45) Date of Patent: Jun. 23, 2026

(54) STATE OF CHARGE ESTIMATION USING BATTERY VOLTAGE

(71) Applicant: Amazon Technologies, Inc., Seattle, WA (US)

(72) Inventor: Mark James Hardiman, Los Altos, CA (US)

(73) Assignee: Amazon Technologies, Inc., Seattle, WA (US)

( * ) Notice: Subject to any disclaimer, the term of this patent is extended or adjusted under 35 U.S.C. 154(b) by 191 days.

(21) Appl. No.: 18/307,425

(22) Filed: Apr. 26, 2023

(51) Int. Cl.
 *G01R 31/389* (2019.01)
 *G01R 31/36* (2020.01)
 *G01R 31/367* (2019.01)
 *G01R 31/374* (2019.01)

(52) U.S. Cl.
 CPC ....... *G01R 31/389* (2019.01); *G01R 31/3648* (2013.01); *G01R 31/367* (2019.01); *G01R 31/374* (2019.01)

(58) Field of Classification Search
 CPC .............. G01R 31/389; G01R 31/3648; G01R 31/367; G01R 31/374
 USPC ......................................................... 324/430
 See application file for complete search history.

(56) References Cited

U.S. PATENT DOCUMENTS

2015/0219721 A1* 8/2015 Yang .................... G01R 31/367
 324/437
2017/0225584 A1* 8/2017 Jin ......................... B60L 3/0046

FOREIGN PATENT DOCUMENTS

CN 103250066 A * 8/2013 ........... G01R 31/367
CN 109752660 B * 7/2021
EP 3627173 B1 * 5/2022 ................ B60L 3/12
SK 20220053250 A * 10/2022

* cited by examiner

*Primary Examiner* — Arleen M Vazquez
*Assistant Examiner* — Robert P Alejnikov, Jr.
(74) *Attorney, Agent, or Firm* — Eversheds Sutherland (US) LLP

(57) ABSTRACT

Systems, methods, and computer-readable media are disclosed for state of charge estimation using battery voltage. The device may determine a first value indicative of a battery voltage during a first time interval, determine a second value indicative of an open circuit voltage of the battery during the first time interval, and determine a third value indicative of a battery temperature during the first time interval. The device may determine, using the second value and the third value, a fourth value indicative of battery resistance during the first time interval, determine, using the first value, the second value, and the fourth value, a first estimated current associated with the battery, and determine a first estimated state of charge value of the battery using the first estimated current.

19 Claims, 6 Drawing Sheets

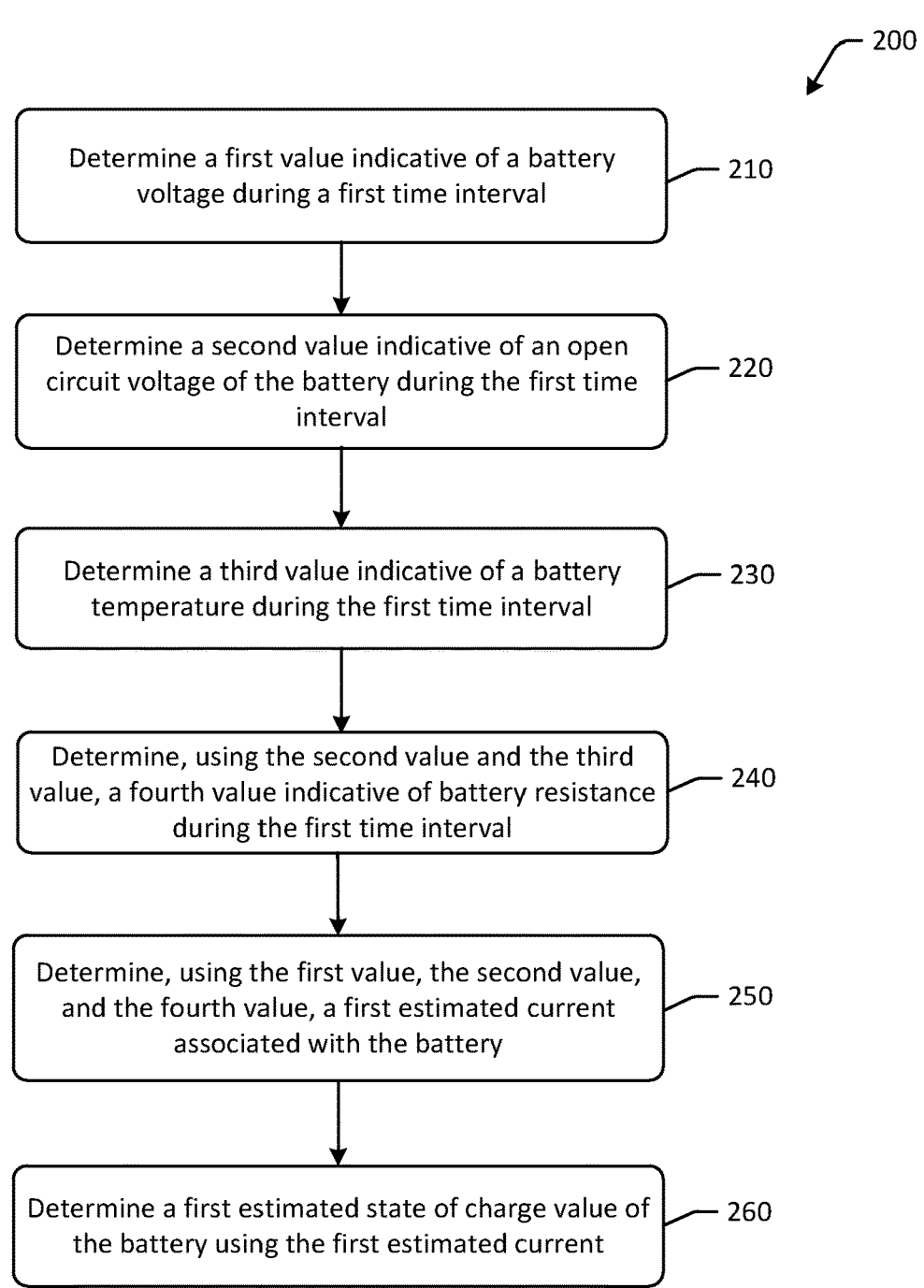

200

Determine a first value indicative of a battery voltage during a first time interval — 210

Determine a second value indicative of an open circuit voltage of the battery during the first time interval — 220

Determine a third value indicative of a battery temperature during the first time interval — 230

Determine, using the second value and the third value, a fourth value indicative of battery resistance during the first time interval — 240

Determine, using the first value, the second value, and the fourth value, a first estimated current associated with the battery — 250

Determine a first estimated state of charge value of the battery using the first estimated current — 260

FIG. 2

STATE OF CHARGE ESTIMATION USING BATTERY VOLTAGE

BACKGROUND

Electronic devices may include batteries or other portable power sources. Users may view a state of charge of the battery to determine a current status of the battery state of charge, to determine when to charge the battery, and so forth. Such state of charge data may be presented at the device or a connected device. To determine accurate state of charge data for a battery, some devices may use current sensors that detect an amount of current associated with the battery. However, such current sensors may be expensive or otherwise cost prohibitive, and may also consume valuable space inside a device. For devices with small form factors, such as earbuds, there may be insufficient space in the device to include a current sensor. Accordingly, state of charge estimation using battery voltage may be desired.

BRIEF DESCRIPTION OF THE DRAWINGS

FIG. 2 is an example process flow for state of charge estimation using battery voltage in accordance with one or more embodiments of the disclosure.

Figure 1:
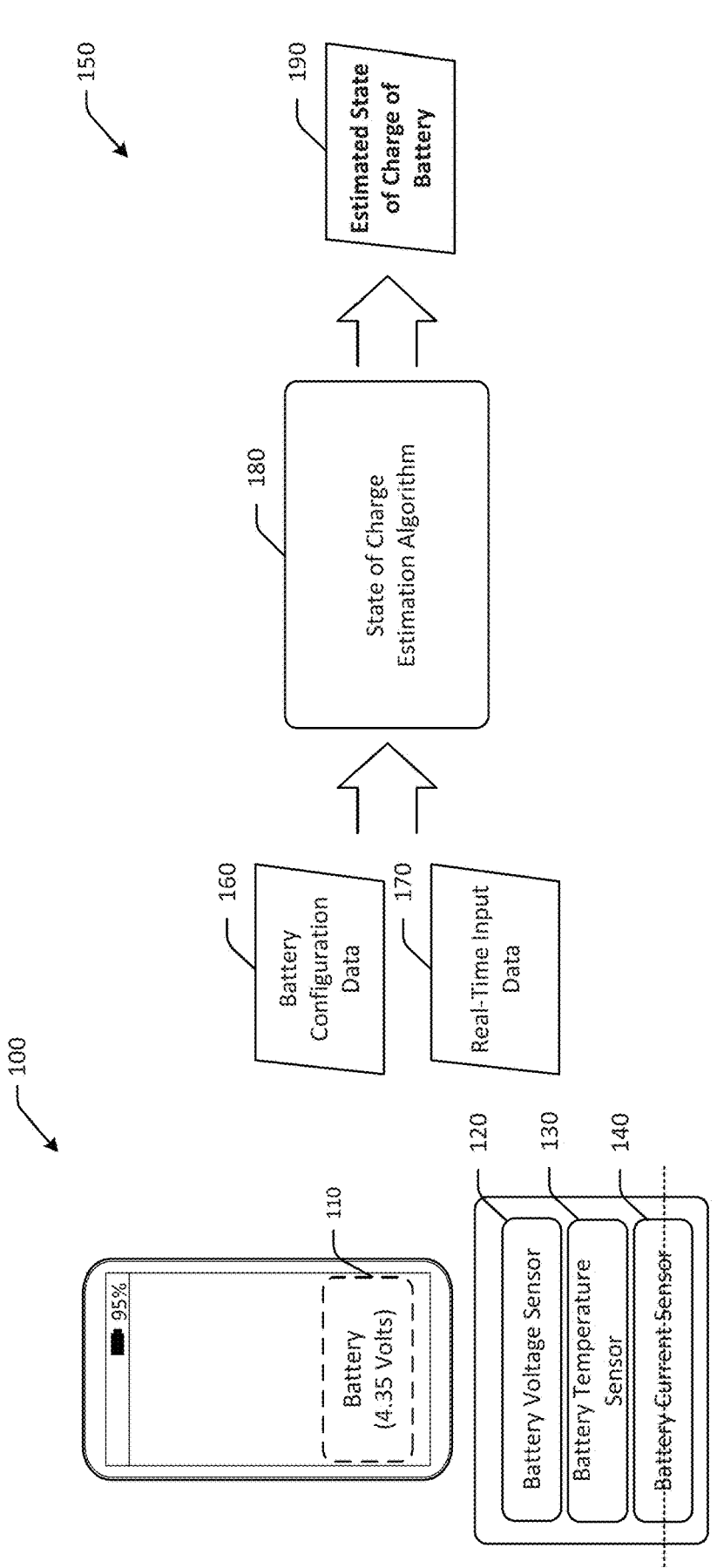
FIG. 1 is a schematic drawing of an example use case of state of charge estimation using battery voltage in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Electronic devices may be used to consume content. Some electronic devices may be portable and may include portable power sources, such as batteries and the like. The batteries or power sources may be rechargeable. Batteries used in electronic devices may have various capacities and/or charging voltages. A state of charge of the battery may represent a percentage or amount of present charge in the battery relative to a maximum charge capacity, such as a state of charge indicating 50% of battery charge voltage remains, 85% of battery charge voltage remains, and so forth. The state of charge may be presented to a user via a device or connected device. To determine the state of charge, devices may use battery current sensors configured to detect an amount of current output by the battery. However, such battery current sensors may increase the cost of a device. Moreover, some devices may have small footprints unable to accommodate a battery current sensor. Such devices may include wireless earbuds, charging cases for wireless earbuds, wearable devices, and so forth.

Embodiments may be configured to determine states of charge of batteries without the use of battery current sensors. Some embodiments may be configured to determine states of charge of batteries without the need for a real-time clock, such that state of charge can be accurately determined after a device is rebooted and/or powered off for any length of time. Embodiments may use software-based implementations to estimate a state of charge of a battery within 5% of an actual state of charge of the battery.

This disclosure relates to, among other things, systems, methods, computer-readable media, techniques, and methodologies for determination of state of charge of a battery in an accurate manner that accounts for various usage cycle events, such as powering down of the device, periods of heavy use, periods of no use, and so forth. Certain embodiments include software-based implementations that can estimate the state of charge of a battery without having to rely on a current sensor. Current technology uses a current sensor to determine an estimated state of charge for a particular battery. Accuracy of state of charge determined by embodiments may be similar to that of a current sensor-based estimate with reduced cost and complexity of device design. Some embodiments may determine states of charge using only battery voltage and temperature measurements.

Referring to FIG. 1, an example use case of state of charge estimation using battery voltage in accordance with one or more embodiments of the disclosure. A mobile device 100 may include a battery 110 for which a state of charge may be determined to be 95% as depicted in the example of FIG. 1. The state of charge may be continually and/or periodically updated and presented at the device 100 or at another device. The device 100 may be any device with a battery, and may include any suitable portable device, such as earbuds, a smartphone, an e-reader, a tablet, an audio or video streaming device, an Internet of Things (IoT) device, a product ordering button or device, a home sensor, an aging in place device, an earphone, a speaker device, or another device. In the example of FIG. 1, the device may be a smartphone with a battery 120. The battery 110 may be a rechargeable battery, and may be any suitable type of battery, such as a lithium-ion battery, and the like. The battery 110 may power the device 100. The device 100 may include a battery voltage sensor 120 and a battery temperature sensor 130, but may be devoid of, or otherwise not include a battery current sensor 140. The battery voltage sensor 120 may be configured to determine a voltage of the battery 110 at a particular time. The measured or sensed voltage may be an average voltage of the battery during a time interval and/or may be determined based at least in part on the actual voltage of the battery 110 measured at certain times or during intervals and divided over the time interval. The average voltage may be a normal average or a weighted exponential average. The average voltage may represent the average amount of capacity of the battery 110, or the average maximum output voltage. The temperature of the battery 110 may be a measured or sensed temperature. The battery temperature may be the battery skin temperature, the device temperature, the battery pack temperature, and/or a combination thereof.

The device 100 may execute a process 150 that includes a state of charge estimation algorithm 180 to determine an estimated state of charge of the battery 110 without using a battery current sensor. Battery configuration data 160 and real-time input data 170 may be inputs to the state of charge estimation algorithm 180, and the state of charge estimation algorithm 180 may output an estimated state of charge of the battery 190.

The battery configuration data 160 may include one or more constant values and may be provided by a battery manufacturer. For example, the battery configuration data 160 may include an open circuit voltage lookup table for the battery, a direct-current cell resistance lookup table for the battery, and an initial maximum electrical charge value for the battery when initialized.

The real-time input data 170 may include a charging status (e.g., whether the battery is charging, discharging, full, etc.), an elapsed time since charging or full event, a detected or sensed battery voltage, and a detected or sensed battery temperature.

The state of charge estimation algorithm 180 may be configured to determine an estimated battery current value for the battery in lieu of using a battery current sensor. To determine the estimated battery current value, the state of charge estimation algorithm 180 may determine estimated values for two parameters. First, the state of charge estimation algorithm 180 may determine an estimated open circuit voltage for the battery, and second, the state of charge estimation algorithm 180 may determine an estimated amount of charge in the battery.

The estimated values may be determined by first determining a resistance value of the battery during the time interval, where the resistance value may be determined using the direct-current cell resistance lookup table and battery temperature. Current may be calculated using a difference between the measured battery voltage and the open circuit voltage subsequently divided by the resistance. The change in the estimated amount of charge in the battery may be the current multiplied by the time. To update the estimated parameters, the estimated amount of charge in the battery may be updated by the change in the estimated amount of charge. The open circuit voltage may be determined using the open circuit voltage lookup table and the updated estimated amount of charge. The output may be the state of charge, as determined by dividing the estimated amount of charge by the maximum amount of charge the battery can hold.

The state of charge may therefore act as a fuel gauge is to estimate how much usable electrical charge is left in the battery. Unlike other techniques, such as filtering of voltage measurements (e.g., moving median filter) to get cleaner signals, which do not accurately correct for cell polarization and/or power interruption, embodiments can accurately estimate the battery current based on observed voltage, estimated open circuit voltage, and characterized direct-current cell resistance. The direct-current cell resistance-only equivalent circuit model can be used to estimate current, since the polarization divided by the direct-current cell resistance yields current.

Example embodiments of the disclosure provide a number of technical features or technical effects. For example, in accordance with example embodiments of the disclosure, certain embodiments of the disclosure may provide state of charge data for batteries without battery current sensors. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

ILLUSTRATIVE EMBODIMENTS AND USE CASES

FIG. 2 is an example process flow 200 for state of charge estimation using battery voltage in accordance with one or more embodiments of the disclosure. One or more of the operations of FIG. 2 may be performed at a client device and/or remote server in some embodiments. One or more of the operations of the process flow 200 may be optional and may be performed in any order or at least partially concurrently in some embodiments.

At block 210 of the process flow 200, a first value indicative of a battery voltage during a first time interval may be determined. For example, one or more computer processors at a device may execute one or more modules having computer-executable instructions to determine a first value indicative of a battery voltage output during a first time interval. The device may be devoid of a battery current sensor. The battery voltage output may be a voltage output by the battery during the time interval. The battery voltage may be an average battery voltage during the time interval, a maximum battery voltage during the time interval, a minimum battery voltage during the time interval, or another value representative of the battery voltage during a point in time of the time interval. For example, if the battery was charged to 4.0 volts and was fully discharged, the average battery voltage output for the time interval may be 4.0 volts. Time intervals may span one or more charging events as well. In such instances, the average battery voltage output may be determined by averaging the 4.0 during the first charging event with the voltage output prior to a subsequent charging event. The battery may be at the same device as the one or more computer processors or may be at a different device (e.g., a remote server may perform one or more determinations, etc.). The average battery voltage output of the battery may be determined by a device by monitoring battery voltage over time.

wherein

In some embodiments, time intervals may be event triggered. An example event trigger may be a charging event. For example, the device may determine that a charger state of the device has changed from a first state to a second state, such as from connected to disconnected. The first length of time and the second length of time may have occurred while the charger state was the first state. The charger state may be indicative of whether or not the device is connected to a charger or is otherwise charging. For example, when the device is connected to a charger that is connected to a power source, such as a wall outlet, the charger state may indicate charging, and when the charger or power source is disconnected, the charger state may indicate not charging. A change in charging state may trigger an updated state of charge calculation.

At block 220 of the process flow 200, a second value indicative of an open circuit voltage of the battery during the first time interval may be determined. For example, one or more computer processors may execute one or more modules having computer-executable instructions to determine a second value indicative of an open circuit voltage of the battery during the first time interval may be determined based at least in part on a measured value and/or a previously determined estimated open circuit voltage value.

At block 230 of the process flow 200, a third value indicative of a battery temperature during the first time interval may be determined. For example, one or more computer processors may execute one or more modules having computer-executable instructions to determine a third value indicative of a battery temperature during the first time interval. The temperature may be an average temperature during the time interval, a maximum temperature during the time interval, a minimum temperature during the time interval, or another value representative of the temperature during a point in time of the time interval. The temperature may be an average temperature of the battery pack, the device, a battery skin, and/or the temperature of a different component of the user device and may optionally be averaged over a time interval. In some embodiments, the average temperature may be the average of more than one component temperature over the first time interval. For example, the device may determine a first average temperature of the battery itself, and may determine a second average temperature of the device, such as a device housing or internal device temperature, and may determine the second value using the first average temperature and the second average temperature. In some instances, ranges may be used instead of particular values. For example, the average temperature may represent a time the temperature was between two values. In some embodiments, the battery temperature may be one or more of a battery pack temperature, a battery skin temperature, a device temperature, and/or a combination thereof.

In some embodiments, average voltage values and/or temperature values may be determined over a time interval, instead of, or in addition to, individual voltage values or temperature values determining periodically. For example, the device may determine an average voltage of the battery (e.g., first average battery output voltage, etc.) during a time interval, where the first voltage is the average voltage. The device may determine an average temperature (e.g., first average battery temperature of the battery, etc.) during the time interval, where the first temperature is the average temperature.

At block 240 of the process flow 200, a fourth value indicative of battery resistance during the first time interval may be determined using the second value and the third value. For example, one or more computer processors may execute one or more modules having computer-executable instructions to determine, using the second value and the third value, a fourth value indicative of battery resistance during the first time interval. In some embodiments a lookup table may be used. For example, the device may determine a direct current cell resistance lookup table associated with the battery, and may determine, using the second value, the third value, and the direct current cell resistance lookup table, the fourth value indicative of battery resistance during the first time interval.

At block 250 of the process flow 200, a first estimated current associated with the battery may be determined using the first value, the second value, and the fourth value. For example, one or more computer processors may execute one or more modules having computer-executable instructions to determine, using the first value, the second value, and the fourth value, a first estimated current associated with the battery. The first estimated current may be used in lieu of a measured battery current by a current sensor. In one example, the first estimated current may be determined by calculating a difference between the first value and the second value, and then determining the first estimated current by dividing the difference by the fourth value.

At block 260 of the process flow 200, a first estimated state of charge value of the battery using the first estimated current may be determined. For example, one or more computer processors may execute one or more modules having computer-executable instructions to determine a first estimated state of charge value of the battery using the first estimated current. In some embodiments, the first estimated state of charge value may be determined using a previously determined estimated state of charge. For example, the device may determine a first adjustment to a first estimated amount of charge in the battery during the first time interval by multiplying the first estimated current by a length of the first time interval. The device may determine a second estimated amount of charge in the battery at an end of the first time interval using the first adjustment and the first estimated amount of charge. The first estimated state of charge value can then be determined using the second estimated amount of charge. In one example, a first adjustment to a first estimated amount of charge in the battery for a first time interval can be determined by multiplying the first estimated current by a length of the first time interval. The second estimated amount of charge in the battery at an end of the first time interval can then be determined using the first adjustment and the first estimated amount of charge.

In some embodiments, the device may be configured to determine an open circuit voltage lookup table associated with the battery, and then determine a fifth value indicative of an open circuit voltage of the battery during a subsequent or second time interval using the open circuit voltage lookup table and the second estimated amount of charge. Such values, such as the fifth value and the second estimated amount of charge may be stored in non-volatile memory for subsequent use.

Figure 3:
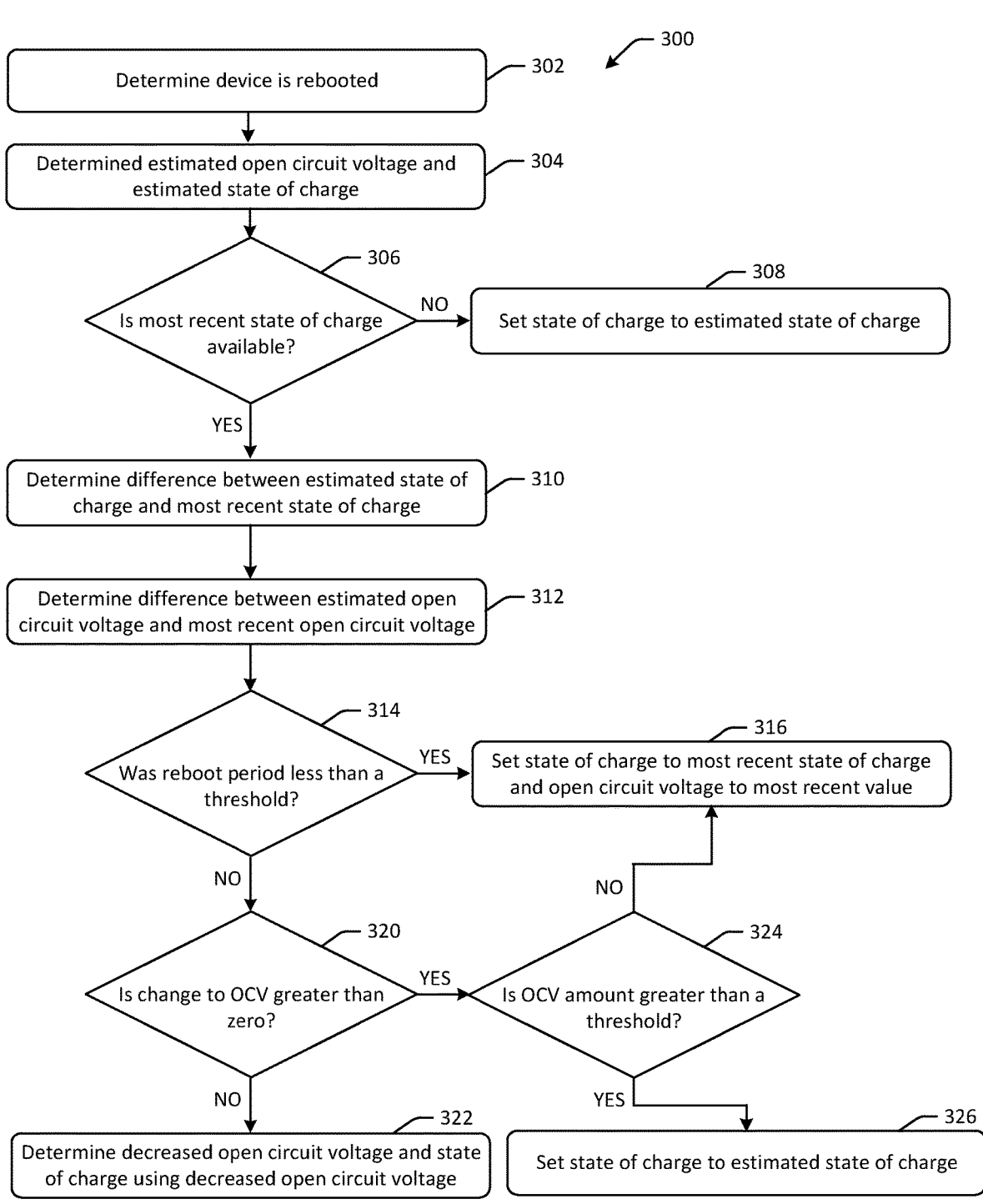
FIG. 3 is an example process flow for initialization of state of charge estimation using battery voltage in accordance with one or more embodiments of the disclosure.

FIG. 3 is an example process flow 300 for initialization of state of charge estimation using battery voltage in accordance with one or more embodiments of the disclosure. One or more of the operations of FIG. 3 may be performed at a client device and/or remote server in some embodiments. One or more of the operations of the process flow 300 may be optional and may be performed in any order or at least partially concurrently in some embodiments.

In FIG. 3, an initialization process is depicted. The estimated parameters described herein can be persisted in non-volatile memory, so at next boot the previous state of charge value may be know. However, since the battery state of charge may change while the device is powered off, embodiments may incorporate special initialization logic to update the state of charge upon boot.

At block 302, the device may determine a reboot event has occurred. At block 304, the device may determine an estimated open circuit voltage and estimated state of charge for the battery. In some embodiments, the device may estimate the present open circuit voltage as a sensed voltage at initialization plus a correction factor based on the expected current during initialization and looked-up resistance value. At determination block 306, the device may determine whether most recent state of charge data is available. If not, the process flow 300 may proceed to block 308, at which the state of charge may be set to the estimated state of charge determined at block 304, and the open circuit voltage to the estimated open circuit voltage determined at block 304. First time initialization may end at block 308.

If it is determined at block 306 that the most recent state of charge data is available, the process flow 300 may proceed to block 310, at which a difference between the estimated state of charge and the most recent state of charge may be determined. At block 312, a difference between the estimated open circuit voltage and the most recent open circuit voltage may be determined.

At determination block 314, the device may determine whether the reboot period was less than a threshold, such as 5 minutes or another threshold. If yes, the process flow 300 may proceed to block 316, at which the state of charge may be set to the most recent state of charge value and the open circuit value may be set to the most recent open circuit value. Accordingly, if the device determines that the reset was brief (e.g., a quick reset/reboot), then the persisted state of charge from the last boot cycle can be used. Other indicators of a brief reset may include reboot reasons such as a firmware reboot, a device power shut off, and the like.

If it is determined at determination block 314 that the reboot period was not less than a threshold, a determination may be made at determination block 320 as to whether the open circuit voltage change is greater than zero. If not, the process flow 300 may proceed to block 322 at which a decreased open circuit voltage and state of charge may be determined. If yes, a determination may be made at block 324 as to whether the change in open circuit voltage was greater than a threshold, such as 500 mV. If yes, the process flow 300 may proceed to block 326 at which the state of charge may be set to the estimated state of charge. If not, the process flow 300 may proceed to block 316, at which the state of charge may be set to the most recent state of charge value and the open circuit value may be set to the most recent open circuit value. Some embodiments may assign a percent-trustworthiness to the new open circuit voltage reading.

Accordingly, in one example, the device may determine that the device is rebooted, determine that the first estimated state of charge value is known after the device is rebooted, and may determine a fifth value indicative of an open circuit voltage of the battery during a second time interval. The device may determine that a difference between the fifth value and the second value is less than a threshold, and may determine that a state of charge of the battery is the first estimated state of charge value.

In another example, the device may determine that the device is rebooted, determine that the first estimated state of charge value is known after the device is rebooted, and determine a fifth value indicative of an open circuit voltage of the battery during a second time interval. The device may determine that a difference between the fifth value and the second value is greater than a threshold, and determine, using a lookup table, a second estimated state of charge based at least in part on the fifth value.

Figure 4:
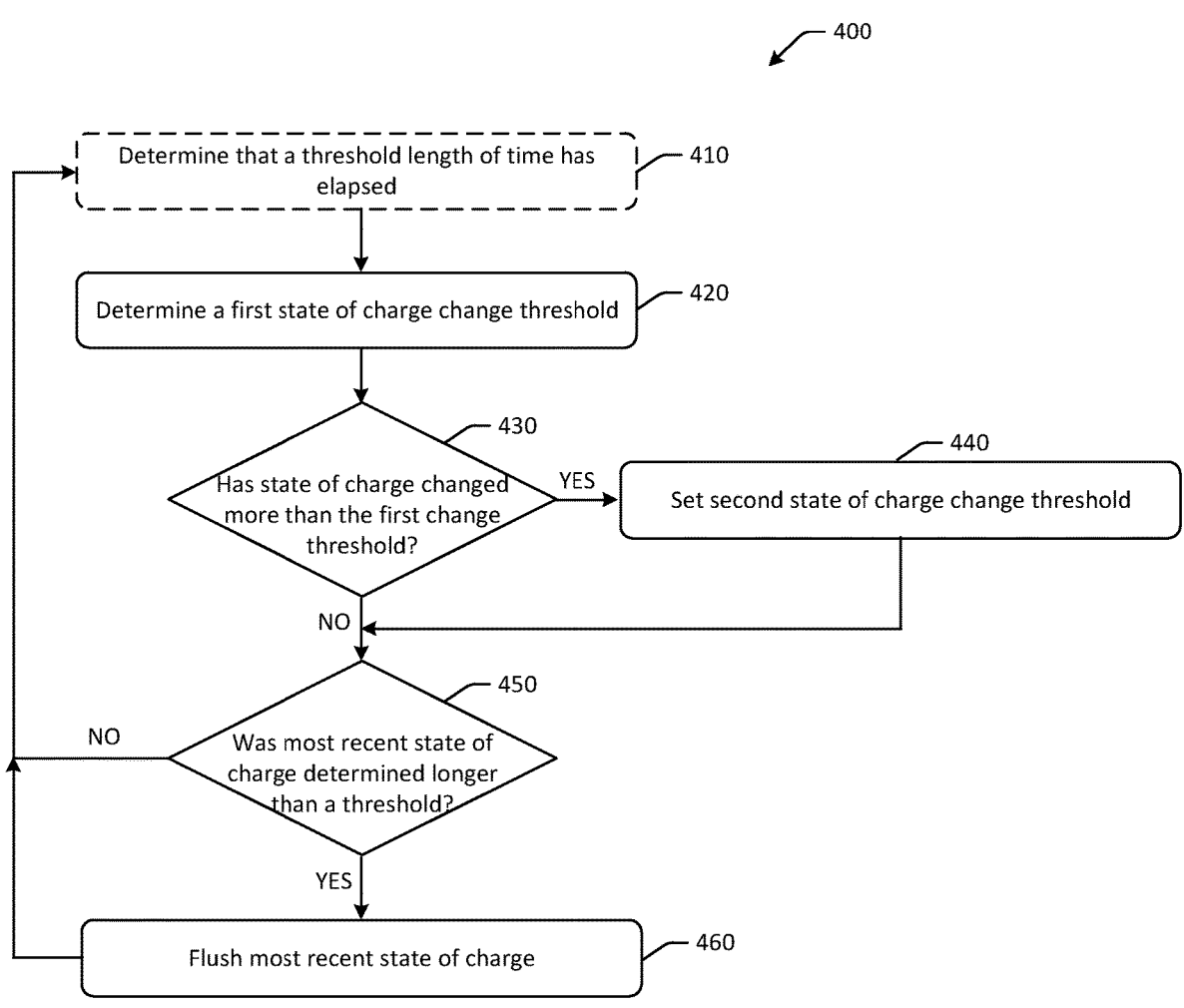
FIG. 4 is an example process flow for a time-based update of state of charge estimation using battery voltage in accordance with one or more embodiments of the disclosure.
Figure 5:
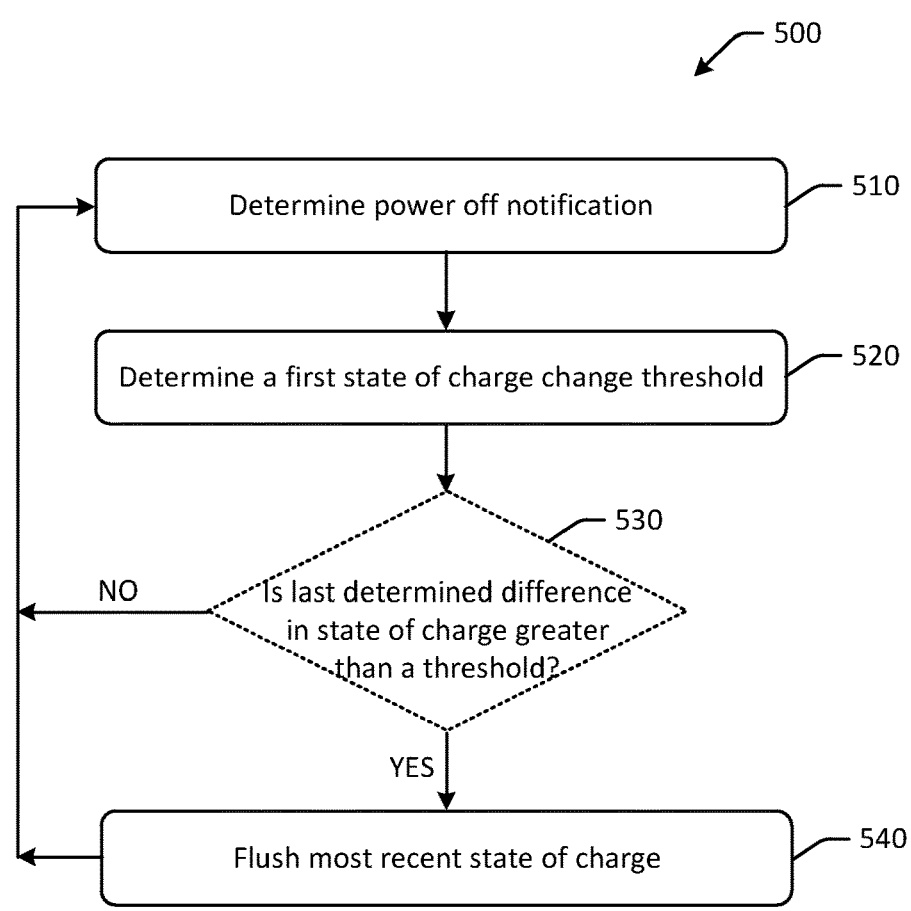
FIG. 5 is an example process flow for an event triggered update of state of charge estimation using battery voltage in accordance with one or more embodiments of the disclosure.

FIG. 4 is an example process flow for a time-based update of state of charge estimation using battery voltage in accordance with one or more embodiments of the disclosure. FIG. 5 is an example process flow for an event triggered update of state of charge estimation using battery voltage in accordance with one or more embodiments of the disclosure and will be discussed in conjunction with FIG. 4. One or more of the operations of FIGS. 4-5 may be performed at a client device and/or remote server in some embodiments. One or more of the operations of the process flows 400, 500 may be optional and may be performed in any order or at least partially concurrently in some embodiments.

In some embodiments, a combination of a variable-cadence flush with a shutdown trigger flush can be used to maintain accuracy of states of charge over time. When a shutdown notification is issued by the software system (e.g., in response to a normal shutdown procedure, like user power-off), the fuel gauge gets notified and flushes state of charge data to flash. To guard against ungraceful shutdown, every 5% change or other threshold in state of charge may be deleted when more than 5% state of charge remains. If below 5% or other threshold, data may be flushed every 1% change in state of charge.

In FIG. 4, a cadence-based update can be used to manage state of charge accuracy. At optional block 410, the device may determine that a threshold length of time has elapsed. For example, the state of charge data may be flushed or deleted after certain time intervals. At block 420, the device may determine a first state of charge change threshold, such as 5%. At block 430, the device may determine whether the state of charge has changed greater than the first change threshold. If so, at block 440, the device may set a second state of charge change threshold, such as 1%. If not, at block 450 the device may determine whether the most recent state of charge was determined longer than a threshold length of time ago. If not, the process flow 400 may return to block 410. If so, the process flow may flush the most recent state of charge at block 460.

Accordingly, the device may determine that the first estimated state of charge value is greater than a first threshold, and may determine that a difference between the first estimated state of charge value and a second estimated state of charge value is greater than a second threshold. The device may cause the second estimated state of charge value to be deleted from the memory.

In FIG. 5, a trigger-based update is depicted. At block 510, the device may determine a deep sleep notification or other type of power off notification. At block 520 the device may determine a first state of charge change threshold, such as 5%. At optional block 530, the device may determine whether the last determined state of charge difference is more than the first change threshold. If not, the process flow 500 may return to block 510. If so, the process flow may flush the most recent state of charge at block 540.

One or more operations of the methods, process flows, or use cases of FIGS. 1-5 may have been described above as being performed by a user device, or more specifically, by one or more program module(s), applications, or the like executing on a device. It should be appreciated, however, that any of the operations of the methods, process flows, or use cases of FIGS. 1-5 may be performed, at least in part, in a distributed manner by one or more other devices, or more specifically, by one or more program module(s), applications, or the like executing on such devices. In addition, it should be appreciated that processing performed in response to the execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-5 may be described in the context of the illustrative devices, it should be appreciated that such operations may be implemented in connection with numerous other device configurations.

The operations described and depicted in the illustrative methods, process flows, and use cases of FIGS. 1-5 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-5 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Computer Architecture

Figure 6:
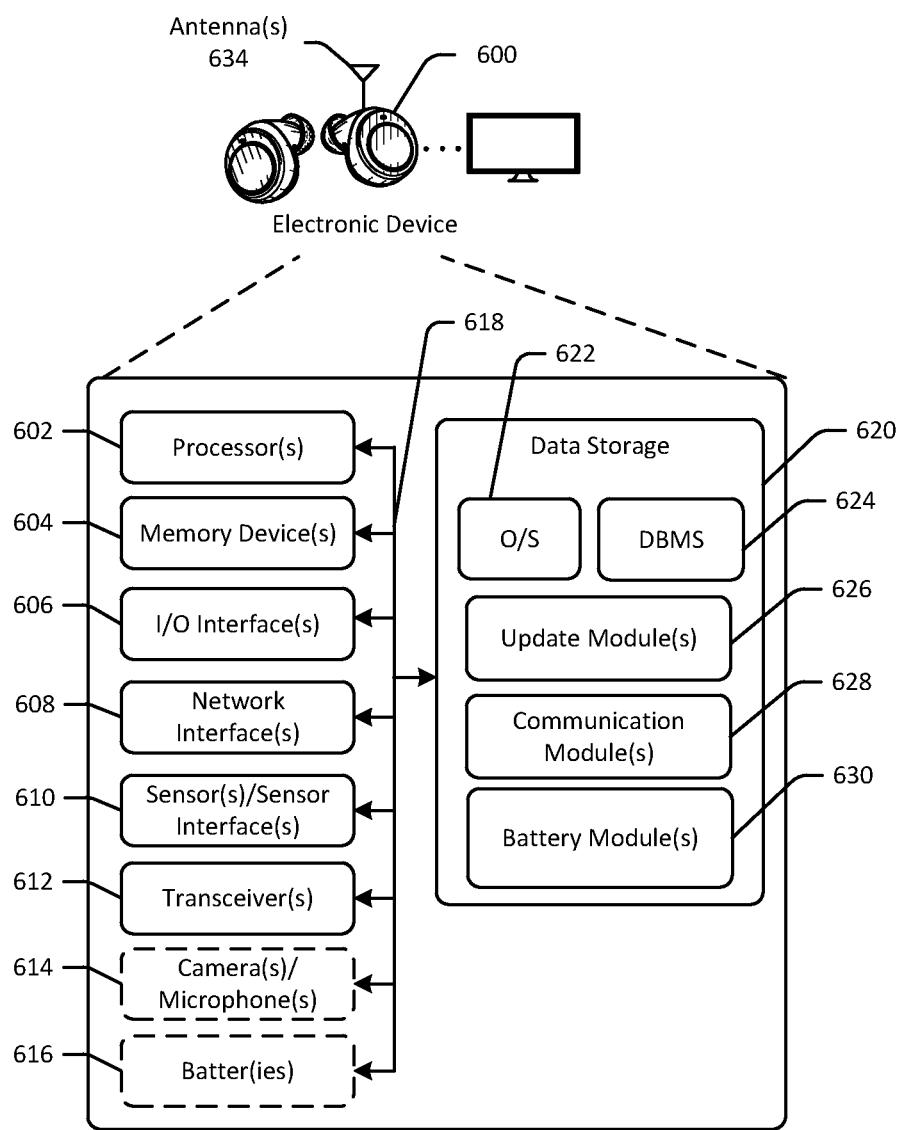
FIG. 6 schematically illustrates an example architecture of an electronic device in accordance with one or more embodiments of the disclosure.

FIG. 6 is a schematic block diagram of one or more illustrative electronic device(s) 600 in accordance with one or more example embodiments of the disclosure. The electronic device(s) 600 may include any suitable computing device including, but not limited to, a server system, earbuds, a mobile device such as a smartphone, a tablet, an e-reader, a wearable device, or the like; a desktop computer; a laptop computer; a content streaming device; a set-top box; a scanning device; or the like. The electronic device(s) 600 may correspond to an illustrative device configuration for the device(s) of FIGS. 1-5.

The electronic device(s) 600 may be configured to communicate with one or more servers, user devices, or the like. The electronic device(s) 600 may be any suitable device, such as a mobile device, and may optionally be configured to determine voice commands, determine wake word utterances, determine and/or control other devices, and other operations. The electronic device(s) 600 may be configured to present content, detect sound, output digital content, and other functionality. In some embodiments, a single remote server or a single group of remote servers may be configured to perform more than one type of functionality in conjunction with an electronic device.

The electronic device(s) 600 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the electronic device(s) 600 may include one or more processors (processor(s)) 602, one or more memory devices 604 (also referred to herein as memory 604), one or more input/output (I/O) interface(s) 606, one or more network interface(s) 608, one or more sensor(s) or sensor interface(s) 610, one or more transceiver(s) 612, one or more optional camera(s) and/or microphone(s) 614, one or more batteries 616, and data storage 620. The electronic device(s) 600 may further include one or more bus(es) 618 that functionally couple various components of the electronic device(s) 600. The electronic device(s) 600 may further include one or more antenna(s) 634 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 618 may include at least one of a system bus, a memory bus, an address bus, or a message bus, and may permit the exchange of information (e.g., data (including computer-executable code), signaling, etc.) between various components of the electronic device(s) 600. The bus(es) 618 may include, without limitation, a memory bus or a memory controller, a peripheral bus, an accelerated graphics port, and so forth. The bus(es) 618 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 604 of the electronic device(s) 600 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 604 may include multiple different types of memory such as various types of static random access memory (SRAM), various types of dynamic random access memory (DRAM), various types of unalterable ROM, and/or writeable variants of ROM such as electrically erasable programmable read-only memory (EE-PROM), flash memory, and so forth. The memory 604 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 620 may include removable storage and/or non-removable storage including, but not limited to, magnetic storage, optical disk storage, and/or tape storage. The data storage 620 may provide non-volatile storage of computer-executable instructions and other data. The memory 604 and the data storage 620, removable and/or non-removable, are examples of computer-readable storage media (CRSM) as that term is used herein.

The data storage 620 may store computer-executable code, instructions, or the like that may be loadable into the memory 604 and executable by the processor(s) 602 to cause the processor(s) 602 to perform or initiate various operations. The data storage 620 may additionally store data that may be copied to the memory 604 for use by the processor(s) 602 during the execution of the computer-executable instructions. Moreover, output data generated as a result of execution of the computer-executable instructions by the processor(s) 602 may be stored initially in the memory 604, and may ultimately be copied to the data storage 620 for non-volatile storage.

More specifically, the data storage 620 may store one or more operating systems (O/S) 622; one or more database management systems (DBMS) 624; and one or more program module(s), applications, engines, computer-executable code, scripts, or the like such as, for example, one or more update module(s) 626, one or more communication module(s) 628, and/or one or more battery module(s) 630. Some or all of these module(s) may be sub-module(s). Any of the components depicted as being stored in the data storage 620 may include any combination of software, firmware, and/or hardware. The software and/or firmware may include computer-executable code, instructions, or the like that may be loaded into the memory 604 for execution by one or more of the processor(s) 602. Any of the components depicted as being stored in the data storage 620 may support functionality described in reference to corresponding components named earlier in this disclosure.

The data storage 620 may further store various types of data utilized by the components of the electronic device(s)

600. Any data stored in the data storage 620 may be loaded into the memory 604 for use by the processor(s) 602 in executing computer-executable code. In addition, any data depicted as being stored in the data storage 620 may potentially be stored in one or more datastore(s) and may be accessed via the DBMS 624 and loaded in the memory 604 for use by the processor(s) 602 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like.

The processor(s) 602 may be configured to access the memory 604 and execute the computer-executable instructions loaded therein. For example, the processor(s) 602 may be configured to execute the computer-executable instructions of the various program module(s), applications, engines, or the like of the electronic device(s) 600 to cause or facilitate various operations to be performed in accordance with one or more embodiments of the disclosure. The processor(s) 602 may include any suitable processing unit capable of accepting data as input, processing the input data in accordance with stored computer-executable instructions, and generating output data. The processor(s) 602 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 602 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 602 may be capable of supporting any of a variety of instruction sets.

Referring now to functionality supported by the various program module(s) depicted in FIG. 6, the update module(s) 626 may include computer-executable instructions, code, or the like that responsive to execution by one or more of the processor(s) 602 may perform functions including, but not limited to, requesting and/or receiving software updates, such as over-the-air updates, requesting battery voltage or temperature data, storing data, and the like.

The communication module(s) 628 may include computer-executable instructions, code, or the like that responsive to execution by one or more of the processor(s) 602 may perform functions including, but not limited to, sending and/or receiving data, including content, sending and/or receiving instructions and commands, and the like.

The battery module(s) 630 may include computer-executable instructions, code, or the like that responsive to execution by one or more of the processor(s) 602 may perform functions including, but not limited to, determining a charging voltage or other charging parameter, calculating elapsed time, calculating battery environment values, calculating adjusting charging voltages, determining predicted usage, determining voltage and/or temperature data, and the like.

Referring now to other illustrative components depicted as being stored in the data storage 620, the O/S 622 may be loaded from the data storage 620 into the memory 604 and may provide an interface between other application software executing on the electronic device(s) 600 and the hardware resources of the electronic device(s) 600. More specifically, the O/S 622 may include a set of computer-executable instructions for managing the hardware resources of the electronic device(s) 600 and for providing common services to other application programs (e.g., managing memory allocation among various application programs). In certain example embodiments, the O/S 622 may control execution of the other program module(s). The O/S 622 may include any operating system now known or which may be developed in the future including, but not limited to, any server operating system, any mainframe operating system, or any other proprietary or non-proprietary operating system.

The DBMS 624 may be loaded into the memory 604 and may support functionality for accessing, retrieving, storing, and/or manipulating data stored in the memory 604 and/or data stored in the data storage 620. The DBMS 624 may use any of a variety of database models (e.g., relational model, object model, etc.) and may support any of a variety of query languages. The DBMS 624 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 600 is a mobile device, the DBMS 624 may be any suitable lightweight DBMS optimized for performance on a mobile device.

Referring now to other illustrative components of the electronic device(s) 600, the input/output (I/O) interface(s) 606 may facilitate the receipt of input information by the electronic device(s) 600 from one or more I/O devices as well as the output of information from the electronic device(s) 600 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 600 or may be separate. The I/O devices may further include, for example, any number of peripheral devices such as data storage devices, printing devices, and so forth.

The I/O interface(s) 606 may also include an interface for an external peripheral device connection such as universal serial bus (USB), Fire Wire, Thunderbolt, Ethernet port or other connection protocol that may connect to one or more networks. The I/O interface(s) 606 may also include a connection to one or more of the antenna(s) 634 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The electronic device(s) 600 may further include one or more network interface(s) 608 via which the electronic device(s) 600 may communicate with any of a variety of other systems, platforms, networks, devices, and so forth. The network interface(s) 608 may enable communication, for example, with one or more wireless routers, one or more host servers, one or more web servers, and the like via one or more networks.

The antenna(s) 634 may include any suitable type of antenna depending, for example, on the communications protocols used to transmit or receive signals via the antenna(s) 634. Non-limiting examples of suitable antennas may include directional antennas, non-directional antennas, dipole antennas, folded dipole antennas, patch antennas, multiple-input multiple-output (MIMO) antennas, or the like. The antenna(s) 634 may be communicatively coupled to one or more transceivers 612 or radio components to which or from which signals may be transmitted or received.

As previously described, the antenna(s) 634 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(s) 634 may additionally, or alternatively, include a Wi-Fi antenna configured to transmit or receive signals in accordance with established standards and protocols, such as the IEEE 802.11 family of standards, including via 2.4 GHZ channels (e.g., 802.11b, 802.11g. 802.11n), 5 GHz channels (e.g., 802.11n, 802.11ac), or 60 GHz channels (e.g., 802.11ad). In alternative example embodiments, the antenna(s) 634 may be configured to transmit or receive radio frequency signals within any suitable frequency range forming part of the unlicensed portion of the radio spectrum.

The antenna(s) 634 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 612 may include any suitable radio component(s) for—in cooperation with the antenna(s) 634—transmitting or receiving radio frequency (RF) signals in the bandwidth and/or channels corresponding to the communications protocols utilized by the electronic device(s) 600 to communicate with other devices. The transceiver(s) 612 may include hardware, software, and/or firmware for modulating, transmitting, or receiving—potentially in cooperation with any of antenna(s) 634—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 612 may further include hardware, firmware, or software for receiving GNSS signals. The transceiver(s) 612 may include any known receiver and baseband suitable for communicating via the communications protocols utilized by the electronic device(s) 600. The transceiver(s) 612 may further include a low noise amplifier (LNA), additional signal amplifiers, an analog-to-digital (A/D) converter, one or more buffers, a digital baseband, or the like.

The sensor(s)/sensor interface(s) 610 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The camera(s) 614 may be any device configured to capture ambient light or images. The microphone(s) 614 may be any device configured to receive analog sound input or voice data. The batter(ies) 616 may be any suitable power storage device, such as a lithium ion battery and may be in various form factors, such as a coin cell form factor, a cylindrical form factor, etc.

It should be appreciated that the program module(s), applications, computer-executable instructions, code, or the like depicted in FIG. 6 as being stored in the data storage 620 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 600, and/or hosted on other computing device(s) accessible via one or more networks, may be provided to support functionality provided by the program module(s), applications, or computer-executable code depicted in FIG. 6 and/or additional or alternate functionality. Further, functionality may be modularized differently such that processing described as being supported collectively by the collection of program module(s) depicted in FIG. 6 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 6 may be implemented, at least partially, in hardware and/or firmware across any number of devices.

It should further be appreciated that the electronic device(s) 600 may include alternate and/or additional hardware, software, or firmware components beyond those described or depicted without departing from the scope of the disclosure. More particularly, it should be appreciated that software, firmware, or hardware components depicted as forming part of the electronic device(s) 600 are merely illustrative and that some components may not be present or additional components may be provided in various embodiments. While various illustrative program module(s) have been depicted and described as software module(s) stored in the data storage 620, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for case of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. A device comprising:
a battery having a maximum charging capacity, wherein a first state of charge of the battery is 100% when charged to the maximum charging capacity;
a first sensor configured to measure voltage of the battery;
a second sensor configured to measure temperature of the battery;
memory configured to store computer-executable instructions; and
at least one computer processor configured to access the memory and execute the computer-executable instructions to:
determine, by the device, a first voltage of the battery during a first time interval;
determine, by the device and using the first voltage, a first open circuit voltage of the battery during the first time interval;

determine, by the device, a first temperature of the battery during a first time interval;
determine, by the device, a first resistance value of the battery based at least in part on the first open circuit voltage and the first temperature;
determine, by the device, a first estimated current of the battery using the first voltage, the first open circuit voltage, and the first resistance value;
determine, by the device, a first adjustment to a first estimated amount of charge in the battery during the first time interval by multiplying the first estimated current by a length of the first time interval;
determine, by the device, a second estimated amount of charge in the battery at an end of the first time interval using the first adjustment and the first estimated amount of charge; and
determine, by the device, a second state of charge of the battery at the end of the first time interval using the second estimated amount of charge.

2. The device of claim 1, wherein the at least one processor is further configured to access the memory and execute the computer-executable instructions to:
determine a second open circuit voltage at the end of the first time interval based at least in part on the second estimated amount of charge; and
determine an updated state of charge using the second open circuit voltage during a second time interval.

3. The device of claim 1, wherein the at least one processor is configured to determine the first estimated current of the battery by executing the computer-executable instructions to:
determine a difference between the first voltage and the first open circuit voltage; and
determine the first estimated current by dividing the difference by the first resistance value.

4. A device comprising:
a battery;
memory configured to store computer-executable instructions; and
at least one computer processor configured to access the memory and execute the computer-executable instructions to:
determine, by the device, a first value indicative of a battery voltage during a first time interval;
determine, by the device, a second value indicative of an open circuit voltage of the battery during the first time interval;
determine, by the device, a third value indicative of a battery temperature during the first time interval;
determine, by the device and using the second value and the third value, a fourth value indicative of battery resistance during the first time interval;
determine, by the device and using the first value, the second value, and the fourth value, a first estimated current associated with the battery; and
determine, by the device, a first estimated state of charge value of the battery using the first estimated current.

5. The device of claim 4, wherein the at least one processor is further configured to access the memory and execute the computer-executable instructions to:
determine, at an end of the first time interval, a first estimated amount of charge in the battery;
determine a first adjustment to the first estimated amount of charge in the battery by multiplying the first estimated current by a length of the first time interval; and determine a second estimated amount of charge in the battery using the first adjustment and the first estimated amount of charge.

6. The device of claim 5, wherein the at least one processor is further configured to access the memory and execute the computer-executable instructions to:

determine, using the second estimated amount of charge, a fifth value indicative of an open circuit voltage of the battery during a second time interval.

7. The device of claim 6, wherein the at least one processor is further configured to execute the computer-executable instructions to:

determine, using the second estimated amount of charge, a sixth value indicative of an open circuit voltage of the battery during a third time interval.

8. The device of claim 4, wherein the at least one processor is configured to determine the first estimated current of the battery by executing the computer-executable instructions to:

determine a difference between the first value and the second value; and determine the first estimated current by dividing the difference by the fourth value.

9. The device of claim 4, wherein the at least one processor is further configured to access the memory and execute the computer-executable instructions to:

determine that the device is rebooted;

determine the first estimated state of charge value after the device is rebooted;

determine a fifth value indicative of an open circuit voltage of the battery during a second time interval;

determine that a difference between the fifth value and the second value is less than a threshold; and determine that a state of charge of the battery is the first estimated state of charge value.

10. The device of claim 4, wherein the at least one processor is further configured to access the memory and execute the computer-executable instructions to:

determine that the device is rebooted;

determine the first estimated state of charge value after the device is rebooted;

determine a fifth value indicative of an open circuit voltage of the battery during a second time interval;

determine that a difference between the fifth value and the second value is greater than a threshold; and determine a second estimated state of charge based at least in part on the fifth value.

11. The device of claim 4, wherein the at least one processor is further configured to access the memory and execute the computer-executable instructions to:

determine that the first estimated state of charge value is greater than a first threshold;

determine that a difference between the first estimated state of charge value and a second estimated state of charge value is greater than a second threshold; and cause the second estimated state of charge value to be deleted from the memory.

12. The device of claim 4, wherein the at least one processor is configured to determine the fourth value by executing the computer-executable instructions to:

determine, using the second value, the third value, and a direct current cell resistance lookup table, the fourth value indicative of battery resistance during the first time interval.

13. The device of claim 4, wherein the device is devoid of a battery current sensor.

14. A method comprising:

determining, by a device comprising a battery, a first value indicative of a battery voltage during a first time interval;

determining, by the device, a second value indicative of an open circuit voltage of the battery during the first time interval;

determining, by the device, a third value indicative of a battery temperature during the first time interval;

determining, by the device and using the second value and the third value, a fourth value indicative of battery resistance during the first time interval;

determining, by the device and using the first value, the second value, and the fourth value, a first estimated current associated with the battery; and determining, by the device, a first estimated state of charge value of the battery using the first estimated current.

15. The method of claim 14, further comprising:

determining, at an end of the first time interval, a first estimated amount of charge in the battery;

determining a first adjustment to the first estimated amount of charge in the battery by multiplying the first estimated current by a length of the first time interval; and determining a second estimated amount of charge in the battery at an end of the first time interval using the first adjustment and the first estimated amount of charge.

16. The method of claim 15, further comprising:

determining a fifth value indicative of an open circuit voltage of the battery during a second time interval using an open circuit voltage lookup table and the second estimated amount of charge.

17. The method of claim 14, further comprising:

determining that the device is rebooted;

determining the first estimated state of charge value after the device is rebooted;

determining a fifth value indicative of an open circuit voltage of the battery during a second time interval;

determining that a difference between the fifth value and the second value is less than a threshold; and determining that a state of charge of the battery is the first estimated state of charge value.

18. The method of claim 14, further comprising:

determining that the first estimated state of charge value is greater than a first threshold;

determining that a difference between the first estimated state of charge value and a second estimated state of charge value is greater than a second threshold; and causing the second estimated state of charge value to be deleted from the memory.

19. The method of claim 14, further comprising:

determining, using the second value, the third value, and a direct current cell resistance lookup table, the fourth value indicative of battery resistance during the first time interval.

* * * * *